United States Patent
Inoue et al.

(10) Patent No.: US 8,643,259 B2
(45) Date of Patent: Feb. 4, 2014

(54) OPTICAL SHEET AND SURFACE LIGHT SOURCE APPARATUS

(75) Inventors: Hiroyasu Inoue, Tokyo (JP); Kenichi Harai, Tokyo (JP)

(73) Assignee: Zeon Corporation, Tokyo (JP)

( * ) Notice: Subject to any disclaimer, the term of this patent is extended or adjusted under 35 U.S.C. 154(b) by 0 days.

(21) Appl. No.: 13/514,821

(22) PCT Filed: Dec. 17, 2010

(86) PCT No.: PCT/JP2010/072804
§ 371 (c)(1),
(2), (4) Date: Jun. 8, 2012

(87) PCT Pub. No.: WO2011/078092
PCT Pub. Date: Jun. 30, 2011

(65) Prior Publication Data
US 2012/0248974 A1 Oct. 4, 2012

(30) Foreign Application Priority Data
Dec. 24, 2009 (JP) .................. 2009-293173

(51) Int. Cl.
*H01J 5/16* (2006.01)
*H01J 61/40* (2006.01)
*H01K 1/26* (2006.01)
*H01K 1/30* (2006.01)

(52) U.S. Cl.
USPC ............................ 313/116; 349/64; 313/504

(58) Field of Classification Search
USPC ............................................... 313/498–512
See application file for complete search history.

(56) References Cited

U.S. PATENT DOCUMENTS

| | | | |
|---|---|---|---|
| 2006/0134434 A1 | 6/2006 | Kokuzawa et al. | |
| 2007/0171671 A1 | 7/2007 | Kurokawa et al. | |
| 2008/0311352 A1 | 12/2008 | Hsu et al. | |
| 2009/0059124 A1* | 3/2009 | Kim | 349/64 |
| 2009/0091255 A1* | 4/2009 | Lee et al. | 313/504 |
| 2009/0122228 A1* | 5/2009 | Ko et al. | 349/64 |
| 2010/0026934 A1* | 2/2010 | Sun et al. | 349/74 |

FOREIGN PATENT DOCUMENTS

| | | |
|---|---|---|
| JP | 2006-199028 A | 8/2006 |
| JP | 2009-31763 A | 2/2009 |
| JP | 2009-266429 A | 11/2009 |
| WO | WO 2005/083475 A1 | 9/2005 |

OTHER PUBLICATIONS

PCT/ISA/210—International Search Report mailed on Jan. 18, 2011, issued in PCT/JP2010/072804.

* cited by examiner

*Primary Examiner* — Donald Raleigh
(74) *Attorney, Agent, or Firm* — Birch, Stewart, Kolasch & Birch, LLP (57) ABSTRACT

An optical sheet comprising: a transparent substrate having a first surface S1 and a second surface S2; a first light diffusion layer provided on a first surface S1 side of the transparent substrate; and a second light diffusion layer provided on a second surface S2 side of the transparent substrate, wherein a haze x1 (%) of the first light diffusion layer and a haze x2 (%) of the second light diffusion layer satisfy $f(x1)/(f(x1)+f(x2)) \le 2/3$ (where when $x \le 88$, a function $f(x)=1.9\times(\ln(1-x/90))^2$, and when $x>88$, the function $f(x)=22.5x-1952.5$) and $(f(x1)+f(x2))\ge 12$; and a surface light source device having the same.

8 Claims, 5 Drawing Sheets

Haze and amount of adding diffusing particles

OPTICAL SHEET AND SURFACE LIGHT SOURCE APPARATUS

FIELD

The present invention relates to a surface light source device including an optical sheet and an organic electroluminescent (hereinafter referred to as "organic EL") element.

BACKGROUND

An organic EL element in which an organic light-emitting layer is provided between a plurality of electrode layers to electrically cause light emission has been studied as to its use as a display element which can be an alternative to a liquid crystal cell. Further, the use of an organic EL device as a surface light source device, such as a flat-type lighting device or a backlight for a liquid crystal display device, taking advantage of the characteristics such as a high luminous efficiency, low driving voltage, light weight, and low cost is also being studied.

One issue when using an organic EL element as a light source for a surface light source device is how to efficiently extract light in a useful form from the element. For example, although the light-emitting layer of the organic EL element itself has a high luminous efficiency, during passage of the light through the layered structure constituting the element until light emission therefrom, the light amount decays due to, e.g., interference in the layers. Thus, such loss of light needs to be reduced as much as possible.

As a method for increasing light extraction efficiency, it has been known that various concavo-convex structures are provided on a light extraction surface side of a light source device (FIG. 4, FIG. 6, and the like in Patent Literature 1, for example). As a component of the organic EL element having such a concavo-convex structure, there has been known an optical sheet including a layer on which a concavo-convex structure is formed using what is called a photopolymer method (2P method).

CITATION LIST

Patent Literature

Patent Literature 1: Japanese Patent Application Laid-Open No. 2009-266429 A

SUMMARY

Technical Problem

However, in addition to the light extraction efficiency, the surface light source device is also required to have brightness uniformity in the light-emitting surface. The aforementioned layer on which a concavo-convex structure is formed is likely to have thickness unevenness caused in the production steps thereof, which may cause defect in in-plane transmittance uniformity of the layer. In particular when a hard material is used in order to increase the mechanical strength of the light-emitting surface, such thickness unevenness is likely to occur. Moreover, if light diffusing property is imparted to the concavo-convex structural layer in order to reduce color tone change depending on viewing angles, transmittance fluctuation due to the thickness unevenness may lead to an extensive level of brightness unevenness in the surface light source device.

Thus, an object of the present invention is to provide an optical sheet having a high in-plane transmittance uniformity, a low degree of color tone change of transmitted light depending on viewing angles, and high mechanical strength, and capable of achieving a high light extraction efficiency when provided on a light-emitting surface side of a surface light source device.

Another object of the present invention is to provide a surface light source device having a high brightness uniformity in a light-emitting surface, a low degree of color tone change on the light-emitting surface depending on viewing angles, high mechanical strength of the light-emitting surface, and a high light extraction efficiency.

Solution to Problem

As a result of study by the present inventors to solve the aforementioned problems, the present inventors have found out that the aforementioned problems can be solved by disposing in a predetermined manner a plurality of layers having a diffusing ability in a predetermined ratio as an optical sheet provided on a light-emitting surface of a surface light source device, to thereby complete the present invention.

That is, the present invention provides the following [1] to [5].

(1) An optical sheet comprising:
a transparent substrate having a first surface S1 and a second surface S2;
a first light diffusion layer provided on a first surface S1 side of the transparent substrate; and
a second light diffusion layer provided on a second surface S2 side of the transparent substrate, wherein
the first light diffusion layer has a first surface D1 and a second surface D2, and the first surface D1 is a surface being opposite to the transparent substrate and is a smooth surface, and
a haze x1 (%) of the first light diffusion layer and a haze x2 (%) of the second light diffusion layer satisfy the following expressions (1) and (2):

$$f(x1)/(f(x1)+f(x2)) \leq 2/3 \qquad \text{expression (1)}$$

$$(f(x1)+f(x2)) \geq 12 \qquad \text{expression (2)}$$

(where when x≤88, a function $f(x)=1.9\times(\ln(1-x/90))^2$, and when x>88, the function $f(x)=22.5x-1952.5$).

(2) An optical sheet comprising:
a transparent substrate having a first surface S1 and a second surface S2;
a first light diffusion layer provided on a first surface S1 side of the transparent substrate; and
a second light diffusion layer provided on a second surface S2 side of the transparent substrate, wherein
the first light diffusion layer has a first surface D1 and a second surface D2, and the first surface D1 is a surface being opposite to the transparent substrate and is a surface having a concavo-convex structure, and
a haze x1 (%) of a light diffusion layer made of the same material and having the same thickness as the first light diffusion layer and having no concavo-convex structure of the first light diffusion layer and a haze x2 (%) of the second light diffusion layer satisfy the following expressions (1) and (2):

$$f(x1)/(f(x1)+f(x2)) \leq 2/3 \qquad \text{expression (1)}$$

$$(f(x1)+f(x2)) \geq 12 \qquad \text{expression (2)}$$

(where when x≤88, a function f(x)=1.9×(ln(1−x/90))², and when x>88, the function f(x)=22.5x−1952.5).
(3) The optical sheet according to (1) or (2), wherein the first light diffusion layer is formed from a composition including a resin and a diffusing element.
(4) The optical sheet according to any one of (1) to (3), wherein the second light diffusion layer is an adhesion layer.
(5) A surface light source device comprising the optical sheet according to any one of (1) to (4) and an organic electroluminescent element.

Advantageous Effects Of Invention

The optical sheet of the present invention has a high in-plane transmittance uniformity, a low degree of color tone change in transmitted light depending on viewing angles, and high mechanical strength, and is capable of achieving a high light extraction efficiency when provided on the light-emitting surface side of the surface light source device.

The surface light source device of the present invention has a high brightness uniformity in the light-emitting surface, a low degree of color tone change depending on viewing angles on the light-emitting surface, high mechanical strength of the light-emitting surface, and a high light extraction efficiency.

DESCRIPTION OF EMBODIMENTS

<Optical Sheet>

An optical sheet of the present invention includes: a transparent substrate having a first surface S1 and a second surface S2; a first light diffusion layer provided on the first surface S1 side of the transparent substrate; and a second light diffusion layer provided on the second surface S2 side of the transparent substrate. In other words, the optical sheet of the present invention includes: a transparent substrate; a first light diffusion layer provided on a surface on one side of the transparent substrate; and a second light diffusion layer provided on a surface on the other side of the transparent substrate.

Figure 1:
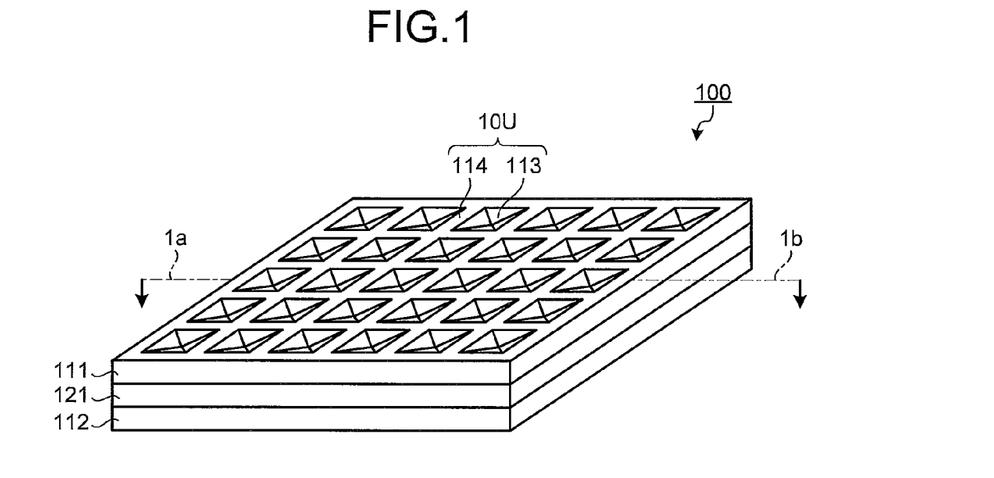
FIG. 1 is a perspective view schematically illustrating an example of an optical sheet of the present invention.
Figure 2:
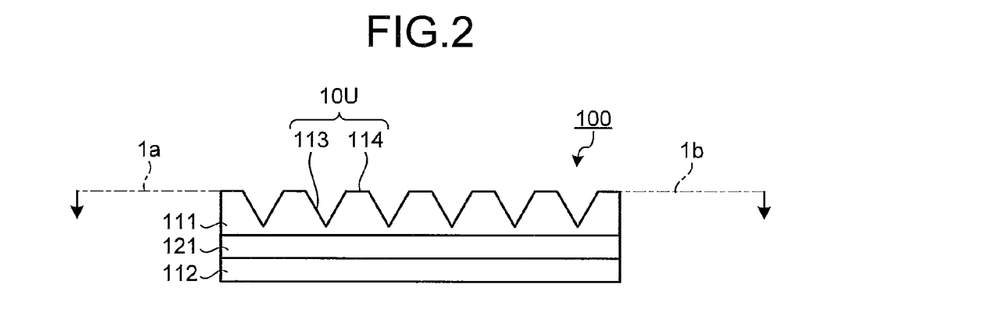
FIG. 2 is a cross-sectional view illustrating a cross-section of the optical sheet illustrated in FIG. 1 cut along a plane that passes through the line 1a-1b in FIG. 1 and that is perpendicular to a surface direction of a transparent substrate.

FIG. 1 is a perspective view schematically illustrating one example of the optical sheet of the present invention. FIG. 2 is a cross-sectional view illustrating a cross-section of the optical sheet illustrated in FIG. 1 cut along a plane that passes through the line 1a-1b in FIG. 1 and that is perpendicular to the surface direction of the transparent substrate.

An optical sheet 100 includes: a transparent substrate 121; a first light diffusion layer 111 provided in direct contact with a surface on one side of the transparent substrate 121; and a second light diffusion layer 112 provided in direct contact with a surface on the other side of the transparent substrate 121. In FIGS. 1 and 2, the upper surface of the transparent substrate 121 is the first surface S1, and the lower surface thereof is the second surface S2. Although the light diffusion layers are provided in direct contact with the transparent substrate in the present embodiment, another layer may be interposed therebetween.

The first light diffusion layer 111 has, on an upper surface thereof (the surface on one side), a concavo-convex structure including a plurality of concave portions 113 and flat portions 114 positioned so as to surround the concave portions 113. The concavo-convex structure defines the surface 10U of the optical sheet 100. The surface 10U is a flat surface parallel to other layers in the optical sheet such as the flat portion 114 and the transparent substrate 121 when macroscopically viewed with taking no account of the concave portions 113, although, when microscopically viewed, the surface 10U is a concavo-convex surface including oblique faces defined by the concave portions 113. Since the drawings of the present application are schematically illustrated, only a small number of concave portions are illustrated on the surface 10U. In an actual device, however, a much greater number of concave portions can be provided on a surface of one optical sheet.

In the present invention, definitions of "one side" and "the other side" are to identify the surface on the front side and the surface on the back side of each layer in an optical sheet. They are defined along a thickness direction in the optical sheet as a whole, and a direction of the first light diffusion layer side as viewed from the transparent substrate corresponds to "one side" and a direction of the second light diffusion layer side as viewed from the transparent substrate corresponds to "the other side". For example, "one side" corresponds to the upper side in FIG. 2, and "the other side" corresponds to the lower side in FIG. 2 in the present embodiment. In other words, a "surface on one side" of the transparent substrate 121 corresponds to the upper surface of the transparent substrate 121, and a "surface on the other side" of the transparent substrate 121 corresponds to the lower surface of the transparent substrate 121 in the present embodiment. A "surface on one side" of the first light diffusion layer 111 corresponds to the upper surface of the first light diffusion layer 111, and a "surface on the other side" of the first light diffusion layer 111 corresponds to the lower surface of the first light diffusion layer 111.

(Transparent Substrate)

In the present invention, a transparent substrate being "transparent" means that it has a level of light transmittance suitable for use as a material for an optical sheet. In the present invention, each of the layers forming the optical sheet may be configured so that each layer has light transmittance suitable for use in an optical member, whereby the optical sheet as a whole has 50% or more total light transmittance.

The material for the transparent substrate is not limited to particular materials, and a glass or a variety of resins capable of forming a transparent layer may be used. Examples of the material for the transparent substrate may include a thermoplastic resin, a thermosetting resin, a UV-ray curable resin, and an electron beam curable resin. Among these, a thermoplastic resin is preferable from the perspective of facilitating processing. Examples of the thermoplastic resin may include a polyester-based resin, a polyacrylate-based resin, and a cycloolefin polymer-based resin. The transparent substrate referred to herein is not limited to a single-layer substrate, and it may be a substrate obtained by stacking a plurality of transparent substrates.

In the optical sheet of the present invention, the thickness of the transparent substrate is preferably, for example, 20 to 300 μm in a case wherein the transparent substrate is made of a resin. If the transparent substrate is made of a glass, the thickness thereof is preferably 10 to 1100 μm. Although the optical sheet of the present invention is referred to as a "sheet" since it has a structure of a thin flat plate shape, it does not necessarily mean that flexibility is an essential requirement. Therefore, a stacked body which employs a glass having a thickness of 700 μm, for example, as the transparent substrate, and which has no flexibility may also be included in the optical sheet of the present invention.

(First Light Diffusion Layer)

The first light diffusion layer is a layer provided on the first surface S1 side of the transparent substrate. In a case where the optical sheet of the present invention is provided in a surface light source device, the first light diffusion layer is usually a layer provided on a surface which will be a light-emitting surface side (i.e., a side farther from the light-emitting layer than the second light diffusion layer and the transparent substrate in the optical sheet). The first light diffusion layer may be provided directly on a surface of the transparent substrate as in the example of the first light diffusion layer 111 in the optical sheet 100 shown in FIGS. 1 and 2. Alternatively, it may be provided via yet another layer interposed therebetween. Direct provision is preferable from the perspective of, e.g., facilitating production.

The material for the first light diffusion layer may be a resin composition having light diffusing property. Specifically, the materials may be a composition containing a variety of resins and a diffusing element. Examples of such a resin may include a thermoplastic resin, a thermosetting resin, and an energy beam curable resin such as a UV-ray curable resin and an electron beam curable resin. Among these, a thermoplastic resin is easily deformable with heat and a UV-ray curable resin has an excellent efficiency due to its high curability. Therefore, these resins enable efficient production of a light diffusion layer having a concavo-convex structure. Accordingly, each of these resins is preferable. Examples of the thermoplastic resin may include a polyester-based resin, a polyacrylate-based resin, and a cycloolefin polymer-based resin. Examples of the UV-ray curable resin may include an epoxy-based resin, an acrylic-based resin, a urethane-based resin, an ene/thiol-based resin, and an isocyanate-based resin. As these resins, those having a plurality of polymerizable functional groups may be preferably used.

The first light diffusion layer has a first surface D1 and a second surface D2, and the first surface D1 is a surface that is opposite to the aforementioned transparent substrate. The second surface D2 is a surface facing the first surface S1 of the transparent substrate. In an embodiment of the present invention, the first surface D1 of the first light diffusion layer is a smooth surface, whereas in another embodiment of the present invention, the first light diffusion layer has a concavo-convex structure on the first surface D1.

"The first surface D1 is a smooth surface" means that the surface has an arithmetic mean roughness of Ra<0.1 μm. On the other hand, "the first surface D1 has a concavo-convex structure" means that the surface has Ra>0.15 μm.

If the first light diffusion layer has a concavo-convex structure on the first surface D1, the material for the first light diffusion layer may preferably be a material having a high degree of hardness when the material is cured, from the perspective of readily forming a concavo-convex structure and readily obtaining abrasion resistance of the concavo-convex structure. Specifically, a material having a pencil hardness of HB or more is preferable, a material having a pencil hardness of H or more is more preferable, and a material having a pencil hardness of 2H or more is further preferable, when a layer of the material having a film thickness of 7 μm is formed on the substrate without a concavo-convex structure. On the other hand, a preferable material for the transparent substrate is a material having a certain level of flexibility in order to facilitate handling during the formation of the first light diffusion layer and the second light diffusion layer and/or handling after the formation of the optical sheet. Combination of such materials enables production of an optical sheet having high handling property and excellent durability. The combination of such materials may be obtained by appropriately selecting resins from among the above-exemplified resins as resins for constituting respective materials. Specifically, a UV-ray curable resin such as acrylate may be used as a resin for constituting the material for the first light diffusion layer, and a film made of an alicyclic olefin polymer or a polyester film may be used as a resin for constituting the material for the transparent substrate. A preferable material combination may thereby be obtained.

Examples of the diffusing element that the first light diffusion layer may contain may include a variety of particles. The particles may be transparent or non-transparent. A metal and a metal compound, and a resin or the like may be used as the material for the particles. Examples of the metal compound may include a metal oxide and a metal nitride. Specific examples of the metal and the metal compound may include a metal having a high reflectance such as silver or aluminum, and a metal compound such as silicon oxide, aluminum oxide, zirconium oxide, silicon nitride, tin-doped indium oxide, and titanium oxide. Examples of the resin may include a methacrylic resin, a polyurethane resin, and a silicone resin.

The shape of the particle may be a spherical shape, a cylindrical shape, a cubic shape, a rectangular shape, a pyramid shape, a conical shape, a star shape, or the like.

The particle diameter of the particle is preferably 0.1 μm or greater and 10 μm or smaller, and more preferably 5 μm or smaller. The particle diameter as used herein refers to a 50% particle diameter in a cumulative distribution in which the amount of particles in volumetric basis is added up with the particle diameter being a horizontal axis. The larger the particle diameter is, the greater the containing ratio of the particles necessary to obtain the desired effect is. The smaller the particle diameter is, the smaller the necessary containing ratio is. Thus, smaller particle diameter results in obtaining desired effects such as a decrease in color tone change depending on viewing angles and an improvement in a light extraction efficiency with a smaller amount of particles. If the particle has a shape other than a spherical shape, the particle diameter is defined to be a diameter of a sphere having the equivalent volume.

In a case where the particle is a transparent particle and the particle is contained in a transparent resin, a difference between the refractive index of the particle and the refractive index of the transparent resin is preferably 0.05 to 0.5, and more preferably 0.07 to 0.5. Any one of the refractive index of the particle and the refractive index of the transparent resin may be greater than the other. If the refractive index of the particle and that of the transparent resin are too close to each other, diffusion effect cannot be obtained and color tone unevenness cannot be suppressed. In contrast, if a difference therebetween is too large, the level of diffusion becomes large, whereby, although color tone unevenness is suppressed, the light extraction effect is spoiled.

In a case where the first light diffusion layer contains the resin and the diffusing element, the ratio between the resin and the diffusing element is preferably 3 to 50% by weight.

The lower limit of the thickness of the first light diffusion layer in the optical sheet of the present invention is preferably 1 μm or greater, and more preferably 5 μm or greater. The lower limit may be also set to 10 μm or greater. On the other hand, the upper limit thereof is preferably 50 μm or smaller, and more preferably 25 μm or smaller. The upper limit may be also set to 15 μm or smaller. In particular, with a thickness of the aforementioned upper limit or less, it is possible to prevent deformation of the optical sheet due to cure shrinkage, such as curling, to obtain an optical sheet having a desirable shape.

The resin listed above as the material for the first light diffusion layer that has a high degree of hardness when it is cured is more likely to cause shrinkage upon curing. Therefore, in general, if such a material is employed as the material for a part of layers in the optical sheet, problems such as uneven thickness and deformation (curling or the like) of the optical sheet are likely to occur. Particularly if the diffusing element is blended in the first light diffusion layer in order to impart a sufficient diffusing ability to the optical sheet and the thickness thereof is increased, deformation due to such shrinkage upon curing is likely to occur. In the optical sheet of the present invention, however, layers having a predetermined haze ratio which will be described later are used as the first light diffusion layer and the second light diffusion layer, whereby an optical sheet having a predetermined diffusing ability can be obtained even if the first light diffusion layer has a thin thickness. As a result, the optical sheet of the present invention can be an optical sheet satisfying all of high surface durability, high in-plane transmittance uniformity based on the uniform thickness, a low degree of color tone change depending on viewing angles based on the sufficient light diffusing ability, and a low level of deformation.

(Second Light Diffusion Layer)

The second light diffusion layer is a layer provided on the second surface S2 side of the transparent substrate, i.e., on the side of the surface of the transparent substrate that is opposite to the surface on which the first light diffusion layer is provided. In a case where the optical sheet of the present invention is provided in a surface light source device, the second light diffusion layer is a layer usually provided on a light-incident surface side (i.e., a side closer to the light-emitting layer than the first light diffusion layer and the transparent substrate). The second light diffusion layer may be provided directly on a surface of the transparent substrate as in the example of the second light diffusion layer 112 in the optical sheet 100 shown in FIGS. 1 and 2. Alternatively, it may be provided via yet another layer interposed therebetween. Direct provision is preferable from the perspective of, e.g., facilitating production.

The second light diffusion layer may be a layer having light diffusing property. Particularly, it is preferable that the second light diffusion layer is an adhesion layer having light diffusing property. In other words, the second light diffusion layer may be a layer having a function of effecting adhesion of the optical sheet to another layer of the organic EL element in addition to the function of diffusing light that passes through the optical sheet. Providing as the second light diffusion layer an adhesion layer, the optical sheet of the present invention can be easily provided in an organic EL element, and the layer constitution of the organic EL element can be simplified, whereby the light extraction efficiency can be improved. From the perspective of increasing the light extraction efficiency of the organic EL element, it is preferable that the refractive index of the second light diffusion layer is greater than that of the first light diffusion layer. In this case, a layer with no adhesion property may be used as the second diffusion layer, and employment of an energy beam curable resin, a thermosetting resin, or the like may enable provision of a layer having a high refractive index of 1.6 or greater and more preferably 1.67 or greater. Examples of the energy beam curable resin may include a UV-ray curable resin and an electron beam curable resin.

The material for the second light diffusion layer may be any material having light diffusing property. An example of the material for the second light diffusion layer may be a composition of a resin and a diffusing element. In this case, examples of the resin for use may include an epoxy resin, a (meth)acrylic resin, a silicone resin, a urethane resin, a polyimide resin, an acid-modified polyolefin resin, or a mixture thereof. By using these resins, the formation of the second light diffusion layer is facilitated, and the function as the aforementioned adhesion layer can be also imparted to the second light diffusion layer. As the diffusing element, on the other hand, those for the diffusing element of the first light diffusion layer may be used. In a case where the second light diffusion layer contains a resin and a diffusing element, the ratio between the resin and the diffusing element is preferably 3 to 50% by weight.

Another example of the material for the second light diffusion layer may be a randomly-oriented liquid-crystalline substance layer or a cured liquid-crystalline substance layer obtained by curing such a liquid-crystalline substance layer while maintaining such orientation. When light passes through such a randomly-oriented layer, the travelling direction of the light is variously changed, whereby diffusion can be achieved. The randomly-oriented liquid-crystalline substance layer is not limited to a solid layer. For example, the layer may be a liquid layer filled in an appropriate gap.

In a case where a liquid-crystalline substance is used as the second light diffusion layer, examples of such a liquid-crystalline substance may include a variety of smectic liquid crystals, nematic liquid crystals, liquid-crystalline acrylates, and a mixture thereof.

The lower limit of the thickness of the second light diffusion layer in the optical sheet of the present invention is preferably 1 μm or greater, and more preferably 10 μm or greater. Further, the lower limit may be set to 30 μm or greater or 40 μm or greater. On the other hand, the upper limit thereof is preferably 200 μm or smaller, and more preferably 60 μm or smaller.

(Relationship of Haze Values)

In the optical sheet of the present invention, a haze x1 (%) of the first light diffusion layer and a haze x2 (%) of the second light diffusion layer satisfy the following expression (1).

$$f(x1)/(f(x1)+f(x2)) \leq 2/3 \qquad \text{expression (1)}$$

wherein, when $x \leq 88$, function $f(x)=1.9 \times (\ln(1-x/90))^2$, and when $x>88$, function $f(x)=22.5x-1952.5$.

It is more preferable that the haze x1 and the haze x2 satisfy the following expression (1').

$$f(x1)/(f(x1)+f(x2)) \leq 1/2 \qquad \text{expression (1')}$$

Figure 9:
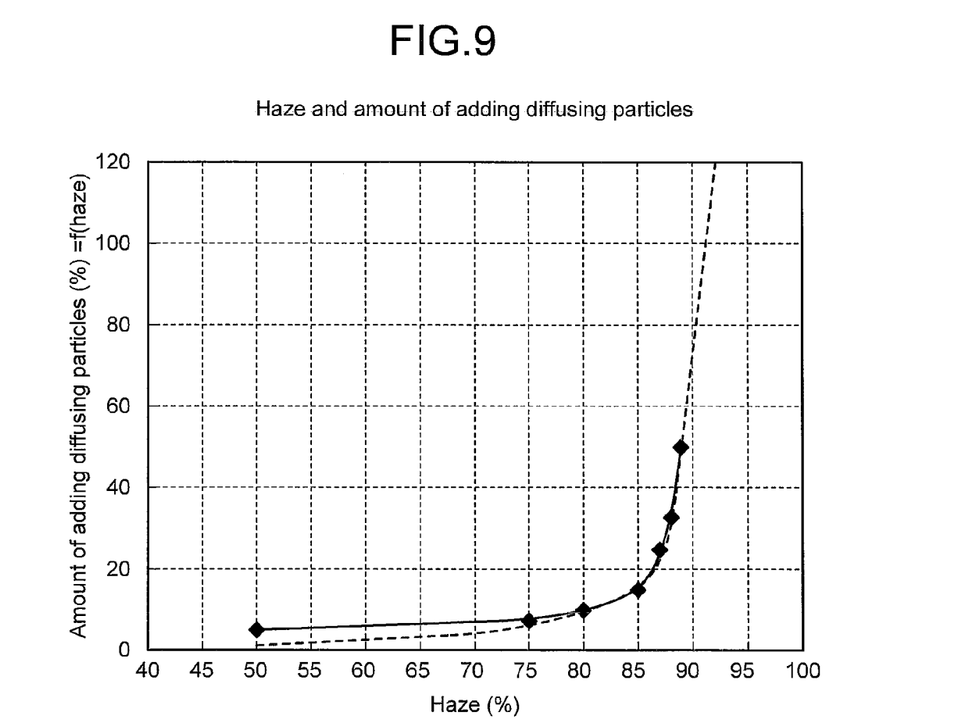
FIG. 9 is a graph for explaining a function f(x) defined in the present invention.

Such a function f(x) is derived from haze values and adding ratio of the diffusing element when flat light diffusion layers having a film thickness of 15 μm are formed on the substrate film with a variety of the adding ratio of the diffusing element having the mean particle diameter of 2 μm and the refractive index of 1.43 in the UV-ray curable resin that has the refractive index of 1.54 after being cured. This relationship is shown in FIG. 9. In the figure, the solid line corresponds to the results of actual measurement, and the broken line corresponds to the values of f(x). In the present application, the values corresponding to the aforementioned adding ratio are used as an index representing scattering capabilities, and the scattering capabilities of two light-scattering layers are compared to each other to define the ranges of the expression (1) and the expression (2).

Further, it is preferable that the optical sheet of the present invention satisfies $$f(x1)+f(x2) \geq 12 \qquad \text{expression (2)}.$$

In other words, it is preferable to have a scattering ability that is equivalent to a case where the additive amount of the diffusing element is set to be greater than 12% by weight in the aforementioned 15 μm light diffusion layer. It is further preferable that the optical sheet of the present invention satisfies $$f(x1)+f(x2) \geq 18 \qquad \text{expression (2')}.$$

If the first surface D1 of the first light diffusion layer is a smooth surface, the haze x1 is the haze of the first light diffusion layer. On the other hand, if the first light diffusion layer has a concavo-convex structure on the first surface D1 thereof, the haze x1 is not the haze of the first light diffusion layer itself, but the haze of another light diffusion layer made of the same material and having the same thickness as the first light diffusion layer and having no concavo-convex structure as in the first light diffusion layer.

The haze x1 and the haze x2 may be measured by forming the first light diffusion layer or the second light diffusion layer that is the subject to be measured on the transparent substrate, and then measuring the haze thereof. Regarding the first light diffusion layer having a concavo-convex structure on the surface thereof, a flat layer made of the same material and having the same mean thickness as the first light diffusion layer is formed and the haze thereof is measured to obtain x1. Alternatively, regarding the first light diffusion layer having a concavo-convex structure already formed thereon, the aforementioned concavo-convex structure is filled with a transparent resin having the same refractive index as the first light diffusion layer so as to flatten the surface thereof, and the haze thereof is measured to obtain x1. As a measuring instrument, a commercially available turbidimeter (such as NDH-300A manufactured by NIPPON DENSHOKU INDUSTRIES, CO., LTD.) may be used in accordance with JIS K7105.

If the haze x1 and the haze x2 satisfy the aforementioned expression (2) in addition to the aforementioned expression (1), it is possible to satisfy all of in-plane transmittance uniformity of the optical sheet, a low degree of color tone change in transmitted light depending on viewing angles, and a high mechanical strength on the surface of the optical sheet.

In other words, in order to enhance the mechanical strength on the surface of the optical sheet, it is necessary to increase the hardness of the light diffusion layer. This necessity is accentuated if a concavo-convex structure is provided on the surface of the optical sheet in order to enhance the light extraction efficiency. Further, in order to suppress the color tone change depending on viewing angles, the haze of the optical sheet needs to be increased, and a large amount of the diffusing element therefore need to be added to the light diffusion layer. However, if a material having a high degree of hardness is used and a large amount of the light diffusion layer is added, the material before being cured becomes highly viscous, whereby it becomes difficult to increase the accuracy in layer formation, and furthermore slight unevenness in thickness leads to a large change in transmittance. As a result, that makes it difficult to obtain in-plane transmittance uniformity. Thus, according to the present invention, the first light diffusion layer for enhancing the hardness and the second diffusion layer for enhancing the diffusing property are provided, and the ratio between the haze values thereof are set within the aforementioned predetermined range, whereby the aforementioned advantageous effects can be obtained.

The values of the haze x1 and the haze x2 are not particularly limited as long as they satisfy the aforementioned requirement. However, the lower limit of x1 is preferably 50% and more preferably 75%, and the upper limit of x1 is preferably 90% and more preferably 89.5%. In particular, the lower limit of x1 falling within the aforementioned preferable range or greater is especially preferable since thereby, even when a minute flaw is generated on the surface of the first light diffusion layer, a reduction in the performance of the optical sheet due to such a flaw (for example, a reduction in the in-plane transmittance uniformity) can be advantageously alleviated. The lower limit of x2 is preferably 75% and more preferably 85%, and the upper limit of x2 is preferably 90% and more preferably 89.5%.

(Concavo-convex Structure)

In the optical sheet of the present invention, it is preferable that the first light diffusion layer has a concavo-convex structure on the first surface D1 thereof (the surface on the front side). The "surface on the front side" of the first light diffusion layer as used herein refers to the surface of the first light diffusion layer that is opposite to the surface on the transparent substrate side. Preferable examples of such a concavo-convex structure may include a concavo-convex structure that includes a plurality of concave portions including oblique faces and also includes flat portions positioned so as to surround the aforementioned concave portions. The "oblique face" as used herein refers to a face forming a non-parallel angle with respect to the surface direction of the transparent substrate. On the other hand, the surface on the flat portion may be configured so as to be a surface parallel to the surface direction of the transparent substrate.

Figure 3:
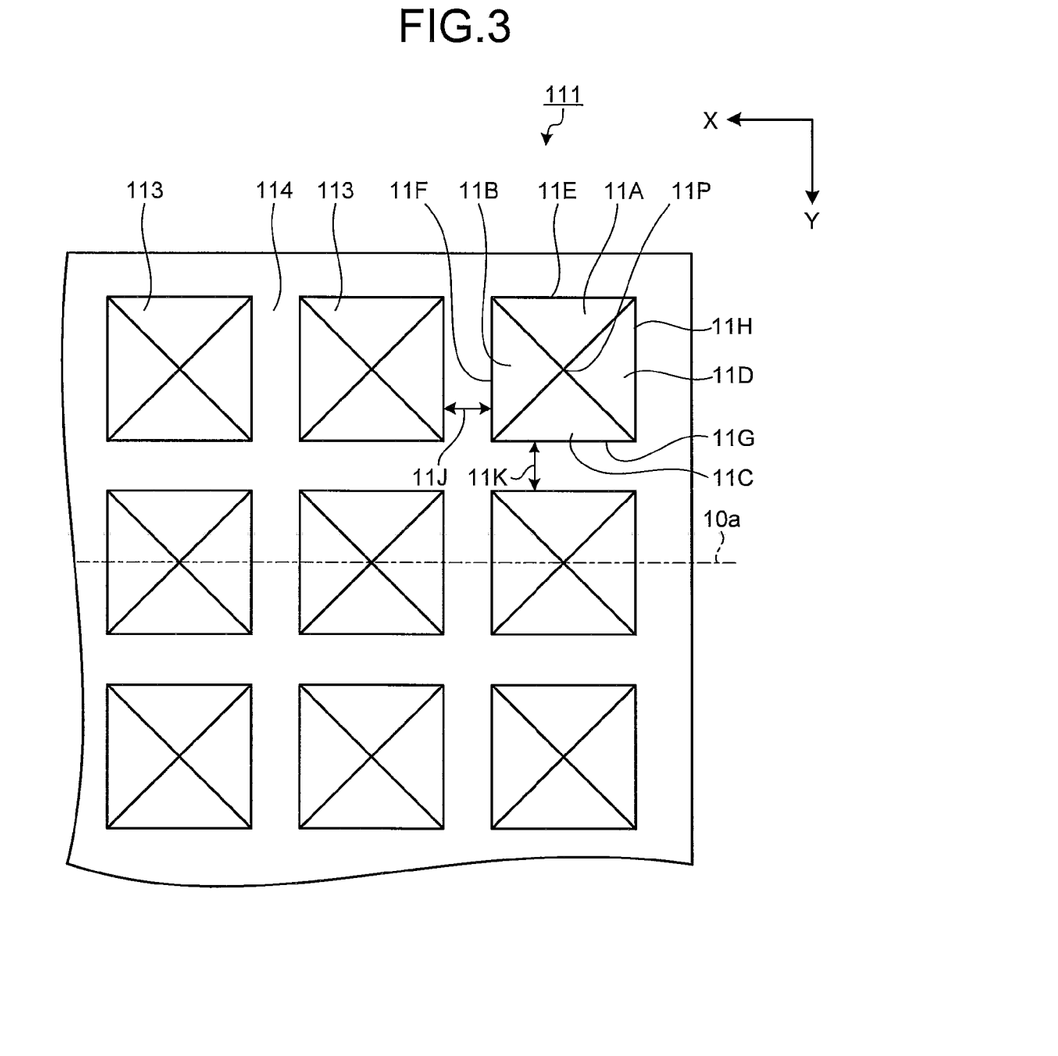
FIG. 3 is a partial top view schematically illustrating a configuration of a surface 10U of an optical sheet 100.
Figure 4:
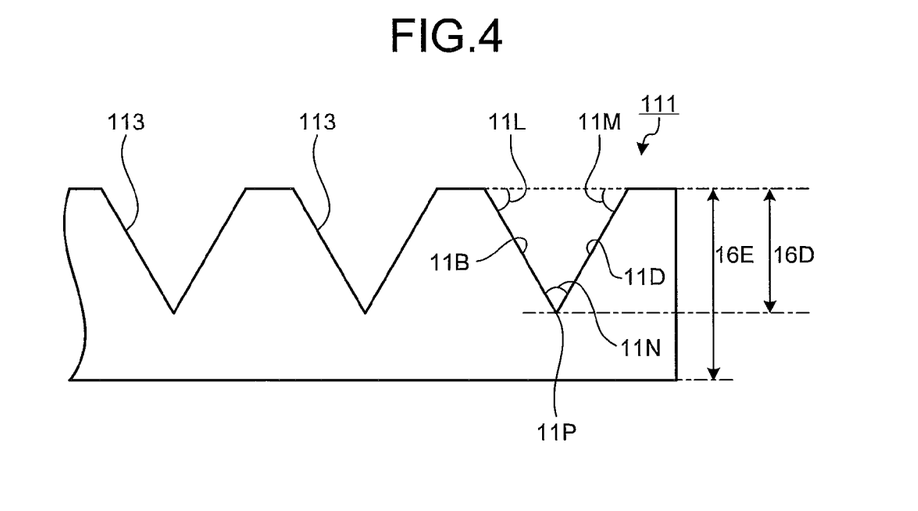
FIG. 4 is a partial cross-sectional view illustrating a cross-section of a first diffusion layer 111 cut along a perpendicular plane that passes through the line 10a in FIG. 3.

As an example of the concavo-convex structure, a concavo-convex structure on the upper surface of the first light diffusion layer 111 of the optical sheet 100 shown in FIGS. 1 and 2 will be described in more detail with reference to FIGS. 3 and 4. FIG. 3 is a partial top view schematically illustrating in an enlarged manner a configuration of the surface 10U of the optical sheet 100 defined by the surface configuration of the first light diffusion layer 111. FIG. 4 is a partial cross-sectional view illustrating a cross-section of the first diffusion layer 111 cut along a perpendicular plane that passes through the line 10a in FIG. 3.

Each of the plurality of concave portions 113 is a concave portion having a square quadrangular pyramid shape. Thus, oblique faces 11A to 11D of the concave portion 113 have an identical shape, and bottom edges 11E to 11H form a square. The line 10a is a line passing through all of apexes 11P in one row of the concave portions 113 and is a line parallel to the bottom edges 11E and 11G of the concave portion 113.

The concave portions 113 are continuously arranged in two arrangement directions orthogonal to each other at regular intervals. One direction X of the two arrangement directions is parallel to the bottom edges 11E and 11G. In this direction X, the plurality of concave portions 113 are aligned at a regular interval 11J. The other direction Y of the two arrangement directions is parallel to 11F and 11H. In this direction Y, the plurality of concave portions 113 are aligned at a regular interval 11K.

Angles that the oblique faces 11A to 11D constituting each concave portion 113 form with the flat portions 114 (regarding the oblique faces 11B and 11D, angles 11L and 11M shown in FIG. 4, respectively) are set to, e.g., 60°. Accordingly, an apex angle of the square quadrangular pyramid constituting the concave portion 113, i.e., an angle formed between oblique faces opposing each other at the apex 11P (regarding the angle formed between the oblique faces 11B and 11D, an angle 11N shown in FIG. 4) is also 60°.

In this manner, the optical sheet has the configuration including the plurality of concave portions and the flat portions positioned so as to surround the concave portions on the surface on the first diffusion layer side which acts as the device light-emitting surface of the surface light source device, and the optical sheet also has light diffusing property. Having such features, it is possible to enhance the light extraction efficiency and to reduce color tone change depending on viewing angles. Furthermore, thereby it is also possible to prevent the generation of a chip or the like of the concavo-convex structure due to an external impact, and it is thus possible to increase the mechanical strength of the device light-emitting surface.

With the aforementioned concavo-convex structure, the optical sheet of the present invention can further reduce at least one of alteration in the x-coordinate and the y-coordinate of chromaticity coordinates in light emitted from the first light diffusion layer side in all hemispherical directions when compared with the case without the aforementioned configuration. Thus, the surface light source device of the present invention having the optical sheet of the present invention can further suppress color tone change depending on viewing angles. As an example of the method for measuring such chromaticity alteration in all hemispherical directions, a spectral radiance meter may be placed along the normal direction of the device light-emitting surface (i.e., the direction perpendicular to the device light-emitting surface when macroscopically viewed with taking no account of the concave portions) and a mechanism capable of rotating the device light-emitting surface in a range of −90 to 90° when the normal direction is set to 0° may be given thereto. With this configuration, the chromaticity coordinates can be calculated from emission spectra measured in the respective directions and thus the alteration thereof can be calculated.

By appropriately adjusting a ratio of an area occupied by the flat portions with respect to the sum of the area occupied by the flat portions and an area occupied by the concave portions when the concavo-convex structure is observed from the direction perpendicular to the optical sheet (hereinafter referred to as a "flat portion ratio"), the light extraction efficiency of the surface light source device can be improved. Specifically, by setting the flat portion ratio to 10 to 75%, a desirable light extraction efficiency can be obtained, and the mechanical strength of the device light-emitting surface can be enhanced.

In a case where the first light diffusion layer has the concavo-convex structure on the surface thereof, examples of the shape of the concave portion may include a conical shape, a shape of a part of a spherical surface, a groove shape, and a shape that is any combination thereof, in addition to the aforementioned pyramid shape. The pyramid shape may be a quadrangular pyramid whose bottom face is a square as illustrated by way of example in the aforementioned concave portion 113. However, the pyramid shape is not limited thereto, and may be a pyramid shape such as a triangular pyramid, a five-sided pyramid, a six-sided pyramid, or a quadrangular pyramid whose bottom face is not a square.

Further, a circular cone and a pyramid as used in the present application include not only a typical circular cone and a pyramid each having a pointed apex portion but also a shape such that the tip thereof is rounded or a shape such that the tip thereof is chamfered flat (a shape such as a truncated circular cone or a truncated pyramid). For example, although the apex portion 11P of the quadrangular pyramid at the concave portion 113 shown in FIG. 4 has a pointed shape, this may be a rounded shape as in an apex portion 61P of a concave portion 613 shown in FIG. 5. Moreover, as in a concave portion 713 shown in FIG. 6, a flat portion 71P may be provided at the apex portion of the pyramid so as to obtain a flatly-chamfered shape.

Figure 5:
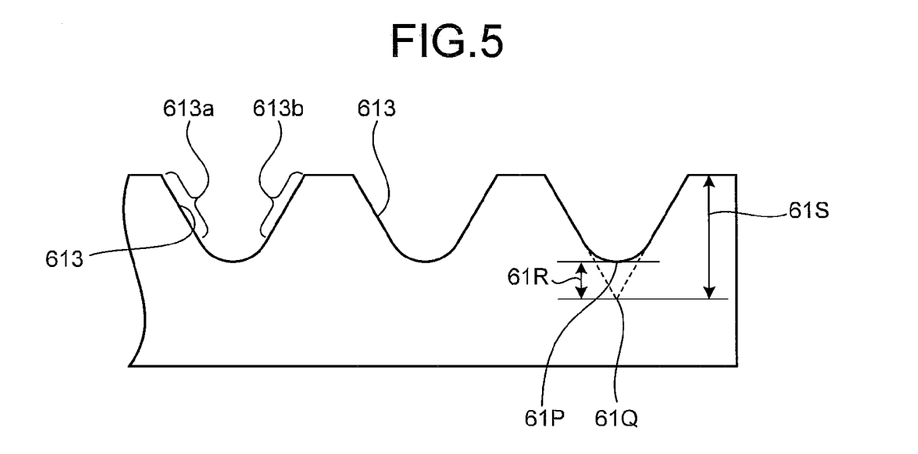
FIG. 5 is a partial cross-sectional view illustrating a modified example of concave portions shown in FIG. 4.
Figure 6:
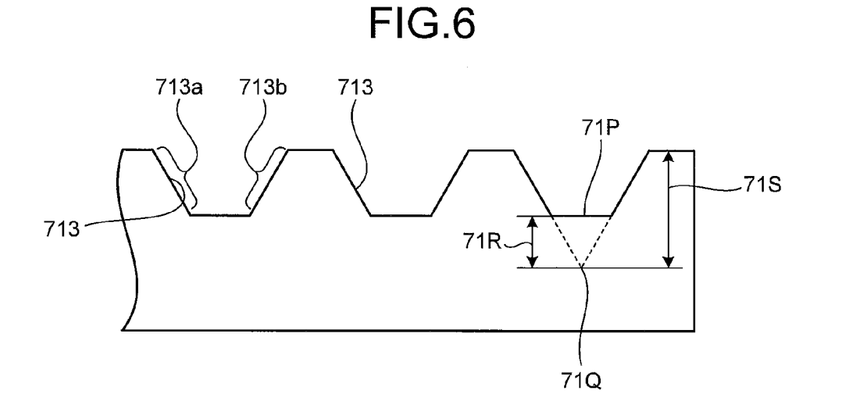
FIG. 6 is a partial cross-sectional view illustrating another modified example of the concave portions shown in FIG. 4.

If the apex portion of the pyramid has a rounded shape as shown in FIG. 5, a height difference 61R between the apex portion 61P and an apex portion 61Q of the pyramid that would not be in a rounded shape but would be in a pointed shape can be set to 20% or less of a height 61S of the pyramid that would not be in a rounded shape but would be in a pointed shape. If the apex portion of the pyramid has a flatly-chamfered shape as shown in FIG. 6, a height difference 71R between the flat portion 71P and an apex portion 71Q of the pyramid whose apex portion would not be in a flat shape but would be in a pointed shape can be set to 20% or less of a height 71S of the pyramid whose apex portion would not be in a flat shape but would be in a pointed shape.

Although the depth of the concave portion in the concavo-convex structure is not limited to a particular depth, it can be set within the range of 1 to 50 μm as the maximum value of centerline mean roughness (Ra(max)) obtained by measuring the surface having the concavo-convex structure formed thereon along a variety of directions (a variety of directions in a plane parallel to the light-emitting surface). If the concavo-convex structure is formed on the first light diffusion layer, a preferable depth of the concave portion may be determined in relative to the thickness of the first light diffusion layer. For example, if a hard material advantageous for maintaining the durability of the first light diffusion layer is used as a material for the first light diffusion layer, the concavo-convex structure layer having a thin thickness can give high flexibility to the optical sheet, whereby handling of the optical sheet in the production steps of the surface light source device becomes easier. Specifically, a ratio of a thickness 16E of the first light diffusion layer 111 with respect to a depth 16D of the concave portion shown in FIG. 4 is preferably 16D:16E=1:1 to 1:3.

In the present invention, an angle formed between the oblique face of the concave portion and the light-emitting surface is preferably 40 to 70°, and more preferably 45 to 60°. For example, if the shape of the concave portion is the quadrangular pyramid shown in FIGS. 4, 11, and 12, the apex angle thereof (the angle 11P in the case of FIG. 4) is preferably 60 to 90°. From the perspective of enhancing the light extraction efficiency while minimizing color tone change depending on viewing angles, it is preferable to have a large angle between the oblique face and the surface of the transparent substrate. Specifically, the angle is, e.g., preferably 55° or greater and more preferably 60° or greater. In this case, the upper limit of this angle may be set to about 70° in consideration of maintaining the durability of the first light diffusion layer.

If the shape of the concave portion is a pyramid shape, a circular cone shape, or a groove shape with the apex portion thereof being rounded or flatly chamfered, the angle of the oblique face excluding the rounded portion or the chamfered portion is taken as the oblique face angle. For example, in the examples shown in FIGS. 5 and 6, faces 613a, 613b, 713a, and 713b are oblique faces of the pyramids. By setting the oblique face angle to such an angle, the light extraction efficiency can be enhanced. The oblique faces of the concavo-convex structure do not always have to have the same angle, and oblique faces having different angles within the aforementioned range may coexist. The angle formed between the oblique face of a circular cone shape and the surface of the transparent substrate may be an angle formed between the generatrix of the circular cone and the surface of the transparent substrate.

On the surface of the first light diffusion layer, a plurality of concave portions may be arranged in an arbitrary manner. For example, the plurality of concave portions may be arranged along two or more directions on the surface. More specifically, as in the concave portions 113 shown in FIGS. 1 and 3, the plurality of concave portions may be arranged along the two directions orthogonal to each other.

In a case where the concave portions are aligned in two or more directions, spacings may be provided between the concave portions adjacent in one or more directions. By providing such spacings, flat portions may be formed. For example, in the alignment of the concave portions 113 shown in FIG. 3, spacings 11J and 11K are provided in the two directions orthogonal to each other, respectively. By providing such spacings, the flat portions 114 are formed. By employing such a configuration, it is possible to obtain both favorable light extraction efficiency and mechanical strength of the sheet surface.

(Production Method)

The optical sheet of the present invention may be produced, for example, by preparing a resin composition (1) suitable for forming the first light diffusion layer and a coating liquid (2) suitable for forming the second light diffusion layer, and, using these materials, forming the first light diffusion layer and the second light diffusion layer on both sides of the transparent substrate, respectively.

(Method for Forming First Light Diffusion Layer)

Examples of the resin composition (1) suitable for forming the first light diffusion layer may include the resin listed above as a material for the light diffusion layer wherein the resin is before being cured, and a composition containing a diffusing agent. The resin composition (1) may optionally contain a solvent. However, from the perspective of realizing facilitated performance of the photopolymer method which will be described later, it is preferable that the resin composition (1) is a composition prepared without adding a solvent thereto and containing little or no component that has to be volatilized during the layer forming step.

On the other hand, when such a resin composition (1) prepared without adding a solvent thereto is applied, the resulting a coating layer tends to have large thickness unevenness. Therefore, if such a material is used as a material for a part of layers in the optical sheet, the thickness thereof generally becomes uneven, and it is therefore likely to cause a problem such as a reduction in in-plane transmittance uniformity. In the optical sheet of the present invention, however, since the first light diffusion layer and the second light diffusion layer having a predetermined haze ratio which will be described later are employed, it is possible to obtain an optical sheet having a predetermined diffusing ability even if the first light diffusion layer has low diffusing property. As a result, the resulting optical sheet can have a variety of favorable characteristics and is capable of being produced easily with the photopolymer method.

The resin composition (1) is applied onto the surface of the transparent substrate to obtain a coating layer, and if necessary the solvent in the coating layer is volatilized. Then if necessary a curing process by, e.g., irradiation with an energy beam is further performed, to obtain the first light diffusion layer.

If the first light diffusion layer has concaves and convexes on the surface thereof, the formation of such a concavo-convex structure may be performed by preparing a mold such as a metal mold having a desired shape and transferring the mold shape at an arbitrary stage after obtaining the aforementioned coating layer.

More specifically, it is preferable that the formation of the concavo-convex structure is performed using the photopolymer method after obtaining the aforementioned coating layer and before performing the curing process. In other words, it is preferable that the mold is brought into contact with the formed coating layer and the coating layer is then cured while maintaining such a state so as to form a cured layer having the concavo-convex structure. In this case, it is preferable to use, as the resin composition (1), a composition capable of being cured by energy beams such as ultraviolet rays. Such a resin composition (1) is applied onto the transparent substrate to obtain a coating layer. Then, the coating layer is irradiated with energy beams such as ultraviolet rays from the light source placed on the back side of the coated surface (the side of the transparent substrate that is opposite to the surface to which the resin composition (1) has been applied) with the mold being in contact with the coating layer, to thereby cure the resin composition (1). Then, the mold is released. By these steps, the first light diffusion layer having a concavo-convex structure with an inverted shape of the concavo-convex structure of the mold can be obtained.

(Method for Forming Second Light Diffusion Layer)

Examples of the coating liquid (2) suitable for forming the second light diffusion layer may include the resin listed above as a material for the light diffusion layer wherein the resin is before being cured, and a composition containing a diffusing agent. Preferably, the coating liquid (2) may further contain a solvent. Examples of such a solvent may include toluene, hexane, cyclohexane, methyl ethyl ketone, and ethyl acetate. By employing as the coating liquid (2) a composition containing such a solvent, the second light diffusion layer can be produced with a uniform thickness even if the diffusing property thereof is at a high level. As a result, it is possible to easily obtain an optical sheet achieving both a low degree of color tone change in transmitted light depending on viewing angles and in-plane transmittance uniformity. In a case where the coating liquid (2) contains a resin, a diffusing element, and a solvent, the ratio of the solvent in the entire coating liquid (2) may be 50 to 95% by weight.

The coating liquid (2) is applied onto the surface of the transparent substrate, and if necessary the solvent is volatilized. Then, if necessary a curing process by, e.g., irradiation with an energy beam is further performed, to obtain the second light diffusion layer. The volatilization of the solvent may be performed by, e.g., heating in a predetermined temperature range for a predetermined period of time. The heating temperature is preferably 40 to 200° C., and more preferably 40 to 140° C. The heating time is more preferably 15 to 600 s.

In the case where the second light diffusion layer is formed as a layer also having a function of an adhesion layer, if necessary, a separator may be attached to the second light diffusion layer after the formation of the second light diffusion layer. Upon producing the surface light source device, the separator may be peeled off immediately before adhesion of the optical sheet of the present invention to another layer, to thereby achieving facilitated adhesion.

<Surface Light Source Device>

The surface light source device of the present invention includes the aforementioned optical sheet of the present invention and an organic EL element.

Figure 7:
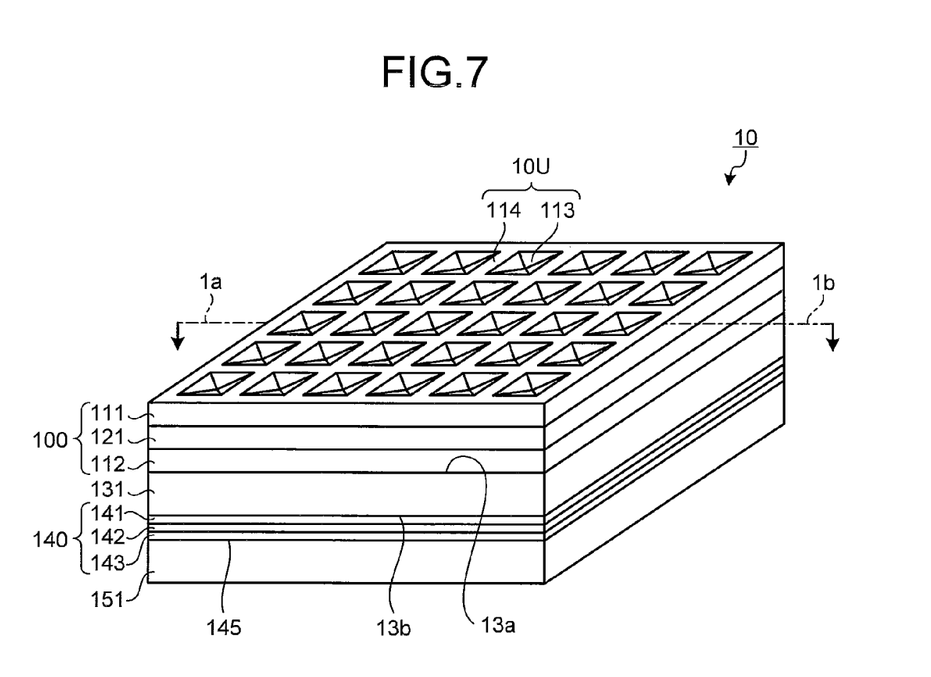
FIG. 7 is a perspective view schematically illustrating one example of a surface light source device of the present invention.
Figure 8:
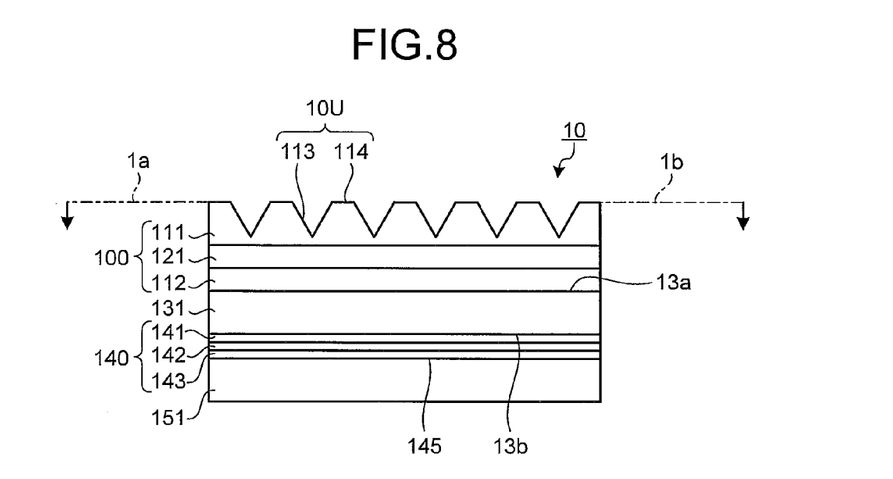
FIG. 8 is a cross-sectional view illustrating a cross-section of the surface light source device 10 illustrated in FIG. 7 cut along a plane that passes through the line 1a-1b in FIG. 7 and that is perpendicular to a surface direction of a transparent substrate.

FIG. 7 is a perspective view schematically illustrating one example of the surface light source device of the present invention including the optical sheet 100 of the present invention shown in FIGS. 1 and 2. FIG. 8 is a cross-sectional view illustrating a cross-section of a surface light source device 10 illustrated in FIG. 7 cut along a plane that passes through the line 1a-1b in FIG. 7 and that is perpendicular to a surface direction of a transparent substrate.

The surface light source device 10 is a device having a rectangular flat-plate-shaped structure and includes a substrate 131 made of a material such as a glass, the optical sheet 100 of the present invention provided in contact with a surface 13a of the substrate 131 on the device light-emitting surface side, and an organic EL element 140 provided in contact with the other surface 13b of the substrate 131. The surface light source device 10 further includes, as an optional component, a sealing substrate 151 on the side of a surface 145 of the organic EL element 140 that is opposite to the device light-emitting surface.

The organic EL element 140 includes a first electrode layer 141, a light-emitting layer 142, and a second electrode layer 143 in this order from the side closer to the substrate 131. The first electrode layer 141 is a transparent electrode, and the second electrode layer 143 is a reflective electrode. Due to such a configuration, light from the light-emitting layer 142 either passes through the first electrode layer 141 or is reflected by the second electrode layer 143 and then passes through the light-emitting layer 142 and the first electrode layer 141, to proceed toward the optical sheet 100 side.

The optical sheet 100 is provided so that the first light diffusion layer 111 is positioned at the upper surface of the surface light source device 10 (i.e., the outermost layer on the light-emitting surface side of the surface light source device 10) and the second light diffusion layer 112 is in contact with the substrate 131. The second light diffusion layer 112 also has a function of an adhesion layer, whereby the optical sheet 100 adheres to the substrate 131.

Most part of the light emitted from the organic EL element 140 passes through the second light diffusion layer 112, the transparent substrate layer 121, and the first light diffusion layer 111 in this order while being diffused by the first and second light diffusion layers and then emits from the surface 10U. Thus, the surface 10U of the optical sheet 100 serves as the device light-emitting surface of the surface light source device 10.

In this manner, the light from the light-emitting layer 142 passes through and emits from the optical sheet 100, the light emits in a diffused manner. As a result, it is possible to suppress color tone change on the light-emitting surface depending on viewing angles as described above. Moreover, since the optical sheet 100 has high level of in-plane transmittance uniformity as described above, the surface light source device 10 has high level of brightness uniformity on the light-emitting surface. Further, the concavo-convex structure on the surface 10U of the optical sheet 100 contributes to improvement of the light extraction efficiency.

(Organic EL Element)

As exemplified by the aforementioned organic EL element 140, the organic EL element used in the surface light source device of the present invention may be an element including two or more electrode layers, and a light-emitting layer which is provided between these electrode layers and emits light by the application of a voltage from the electrodes.

The organic EL element usually has a configuration in which layers such as an electrode and a light-emitting layer forming the element are formed on a substrate, and a sealing member is further provided to cover these layers and to seal the layers such as the light-emitting layer with the substrate and the sealing member. In general, an element which emits light from the side of what is referred to herein as substrate is called a bottom emission type, and an element which emits light from the sealing member side is called a top emission type. The surface light source device of the present invention may be any one of these types. In a case of the bottom emission type, the optical sheet of the present invention may be provided on the surface of the substrate that is opposite to the surface on which the organic EL element is formed. In a case of the top emission type, on the other hand, the optical sheet of the present invention or a combination of the optical sheet of the present invention and an optional layer having a sealing ability may be employed as a sealing member, to configure the surface light source device.

In the present invention, the light-emitting layer constituting the organic EL element is not limited to a particular light-emitting layer, and any of known light-emitting layers may be suitably selected therefor. The luminescent material in the light-emitting layer is not limited to one species, and the number of the light-emitting layers is not limited to one as well. In accordance with an intended usage as a light source, one type of layer alone or a combination of plurality of types of layers may be used, for constituting a light-emitting layer that can emit light having which color or a color close to white.

In addition to the light-emitting layer, the organic EL element may further include other layers between the electrodes, such as a hole injection layer, a hole transport layer, an electron transport layer, an electron injection layer, and a gas barrier layer. The organic EL element may further include optional components such as a wiring for applying electricity to the electrodes, and a surrounding structure for sealing the light-emitting layer.

The electrodes for the organic EL element are not particularly limited, and any of known electrodes may be suitably selected therefor. As in the organic EL element 140 shown in FIGS. 7 and 8, a transparent electrode may be used as the electrode on the side of the light-emitting surface structural layer, and a reflective electrode may be used as the electrode on the opposite side, whereby an organic EL element which emits light toward the light-emitting surface structural layer side can be configured. Alternatively, it may also be possible to use transparent electrodes for both of the electrodes, and provide a reflective member on the side that is opposite to the light-emitting surface structural layer, whereby light emission toward the light-emitting surface structural layer side can be achieved.

Although the materials for constituting the electrodes and the layers provided therebetween are not particularly limited, specific examples thereof may be as follows.

Examples of a material for the transparent electrode may include ITO.

Examples of a material for the hole injection layer may include a starburst aromatic diamine compound.

Examples of a material for the hole transport layer may include a triphenyldiamine derivative.

Examples of a host material for a yellow light-emitting layer may likewise include a triphenyldiamine derivative, and examples of a dopant material for the yellow light-emitting layer may include a tetracene derivative.

Examples of a material for a green light-emitting layer may include a pyrazoline derivative.

Examples of a host material for a blue light-emitting layer may include an anthracene derivative, and examples of a dopant material for the blue light-emitting layer may include a perylene derivative.

Examples of a material for a red light-emitting layer may include a europium complex.

Examples of a material for the electron transport layer may include an aluminum quinoline complex (Alq).

Examples of a material for a cathode may include a material obtained by employing lithium fluoride and aluminum, and successively stacking these by vacuum deposition.

By appropriately combining those listed above or other light-emitting layers, it is possible to obtain a light-emitting layer which is called a stacked type or a tandem type and which generates emission colors having a complimentary color relationship with each other. The combination of the complimentary color relationship may be yellow/blue, green/blue/red, or the like.

(Applications)

The surface light source device of the present invention may be applied to a lighting apparatus, a backlight device, or the like.

The aforementioned illumination apparatus includes the surface light source device of the present invention as a light source, and may further include optional components such as a member for holding the light source, and a circuit for supplying electricity. The aforementioned backlight device includes the surface light source device of the present invention as a light source, and may further include optional components such as a housing, a circuit for supplying electricity, a diffusion plate, a diffusion sheet, and a prism sheet for making emitted light more uniform. The aforementioned backlight device may be used as a backlight for a display device such as a liquid crystal display device for displaying images by the control of pixels and for a display device such as a signboard for displaying fixed images.

(Others)

The present invention is not limited to the aforementioned specific examples, and any changes may be made within the scope of the claims and equivalent thereto.

For example, the optical sheet of the present invention may further include an optional layer in addition to the transparent substrate, the first light diffusion layer, and the second light diffusion layer. Such an optional layer may be not only a layer placed between the transparent substrate, the first light diffusion layer, and the second light diffusion layer but also, e.g., a coating layer further provided on the concavo-convex structure of the surface of the first light diffusion layer. The coating layer may define the concavo-convex structure on the device light-emitting surface of the surface light source device of the present invention.

As the concave portions distributed on the entire surface of the first light diffusion layer, the aforementioned exemplification of the embodiments show only those wherein concave portions of the same shape are distributed. However, concave portions having different shapes may coexist in a mixed manner on the surface of the first light diffusion layer. For example, pyramid-shaped concave portions having different sizes may coexist, pyramid-shaped concave portions and circular cone-shaped concave portions may coexist, and concave portions having a shape obtained by combining a plurality of pyramids together and concave portions having a simple pyramid shape may coexist.

In the aforementioned specific examples, the width of the flat portion constituting the concavo-convex structure and the interval between flat portions adjacent to each other are always constant. However, flat portions having a narrow width and those having a large width may coexist. Also, a region with a narrow interval of flat portions and a region with a large interval of flat portions may coexist. In this manner, an embodiment wherein one or more elements of the height, width, and interval of the flat portion have a size difference exceeding a difference causing interference of emitted light may be realized, whereby rainbow unevenness due to interference can be suppressed.

The reflective electrode layer in the aforementioned specific example may be replaced with a transparent electrode layer and a reflective layer, whereby the configured device can have the same effects as those having the reflective electrode layer.

EXAMPLES

The present invention will now be described in more detail with reference to Examples and Comparative Examples. However, the present invention is not limited thereto.

In the Examples and the Comparative Examples, haze measurement was performed by using a turbidimeter (NDH-300A manufactured by NIPPON DENSHOKU INDUSTRIES, CO., LTD.).

Example 1

1-1. Resin Composition (1)

Particles (silicone resin) having a diameter of 2 μm were added to a UV-ray curable resin (refractive index was 1.54) whose main component is urethane acrylate. The mixture was stirred to disperse the particles, to thereby prepare a resin composition (1) that is the material for the first light diffusion layer. The containing ratio of the particles was set to 10% by weight of the total amount of the resin composition (1). Whereas the viscosity of the UV-ray curable resin was 400 cP, the viscosity of the resin composition (1) was 500 cP.

1-2. Coating Liquid (2))

A resin whose main component is an acid-modified polyolefin resin (refractive index was 1.49) was dissolved in a solvent that had been obtained by mixing methylcyclohexane and ethyl acetate in 8:2 (ratio by weight). To the mixture, particles (silicone resin) having a diameter of 2 μm were added. The mixture was stirred to disperse the particles, to thereby prepare a coating liquid (2) that is the material for the second light diffusion layer. The concentration of the acid-modified polyolefin resin was set to 15% by weight of the total amount of the coating liquid (2). The concentration of the particles was set to 15% by weight of the total amount of the solid content (the sum of the acid-modified polyolefin resin and the particles).

1-3. Adhesion Layer

Two separate application steps were performed to apply coating liquid (2) onto a substrate film (polyester film), and the solvent was evaporated therefrom to form the adhesion layer (i.e., the second light diffusion layer) having a thickness of 45 μm. Further, the separator was laminated thereon to obtain a substrate film with an adhesion layer having a layer constitution of (substrate film)-(adhesion layer)-(separator). Haze of this substrate film with the adhesion layer (i.e., haze x2) was measured, and was found out to be 78%.

1-4. Formation of First Light Diffusion Layer

Onto a surface of the substrate film with the adhesion layer where the substrate film was exposed, the resin composition (1) was applied, to form a coating layer having a thickness of 15 μm. A metal mold was pressed against the coating layer.

While maintaining this state, the coating layer of the resin composition (1) was irradiated with 1 J/cm² of ultraviolet rays through the separator, the adhesion layer, and the substrate film. As a result, the coating layer was cured, and the first light diffusion layer was thereby formed. Thus, an optical sheet 1 having a layer constitution of (first light diffusion layer)-(substrate film)-(adhesion layer)-(separator) was obtained. The surface shape of the metal mold had a shape such that square quadrangular pyramids each having an apex angle of 50° and bottom edges of 15 μm were aligned without any spacings. On the surface of the thus obtained first light diffusion layer, concave portions having an inverted shape of the quadrangular pyramids were provided. The thickness of the thus obtained first light diffusion layer was 18 μm.

Unevenness in light transmittance in the obtained optical sheet 1 was measured by performing scanning along uneven portions with a luminance meter (BM-5A manufactured by Topcon Corporation). The results thereof are shown in Table 1.

1-5. Haze of First Light Diffusion Layer)

Separately from the aforementioned (1-4), the first light diffusion layer was provided on a substrate film that is the same as that prepared in (1-3) in the same manner as that of (1-4) so as to produce a stacked body. Further, a resin having the same refractive index as that of the UV-ray curable resin constituting the resin composition (1) was filled into the square quadrangular pyramid-shaped concave portions on the first light diffusion layer, and then cured in a similar manner to the aforementioned steps, thereby forming another diffusion layer having a smooth surface. Haze of this another diffusion layer (i.e., the haze x1) was measured, and was found out to be 80%. Thus, the optical sheet 1 satisfied the expression (1).

1-6. Formation of Organic EL Element 100 nm of a transparent electrode layer, 10 nm of a hole transport layer, 20 nm of a yellow light-emitting layer, 15 nm of a blue light-emitting layer, 15 nm of an electron transport layer, 1 nm of an electron injection layer, and 100 nm of a reflective electrode layer were formed in this order on one main surface of a glass substrate having a thickness of 0.7 mm. All layers from the hole transport layer to the electron transport layer were formed of organic materials. The yellow light-emitting layer and the blue light-emitting layer have light emission spectra different from each other.

The materials for forming the respective layers from the transparent electrode layer to the reflective electrode layer were as follows:

Transparent electrode layer: tin-doped indium oxide (ITO)
Hole transport layer: 4,4'-bis[N-(naphthyl)-N-phenylamino] biphenyl (α-NPD)
Yellow light-emitting layer: α-NPD containing 1.5% by weight of rubrene
Blue light-emitting layer: 4,4'-dicarbazolyl-1,1'-biphenyl (CBP) containing 10% by weight of iridium complex
Electron transport layer: phenanthroline derivative (BCP)
Electron injection layer: lithium fluoride (LiF)
Reflective electrode layer: Al The transparent electrode layer was formed by using a reactive sputtering method with ITO target, and the surface resistance thereof was set to 10 Ω/square or less. The formation of the layers from the hole injection layer to the reflective electrode layer was performed as follows: a glass substrate having the transparent electrode layer already formed thereon was placed in a vacuum deposition device and the aforementioned materials were successively deposited from the hole transport layer to the reflective electrode layer by means of resistive heating. The system internal pressure was set to $5\times10^{-3}$ Pa, and the evaporation rate was set to 0.1 to 0.2 nm/s.

Further, a wiring for applying electricity was attached to the electrode layers, and the layers from the hole transport layer to the reflective electrode layer were sealed by a sealing member. Thus, the organic EL element was obtained.

1-7. Surface Light Source Device)

The separator of the optical sheet obtained in the aforementioned (1-4) was peeled off, and the reminder was attached to the organic EL element obtained in (1-6). The attachment was performed so that the exposed adhesion layer caused adhesion to the glass substrate of the organic EL element. As a result, a surface light source device was obtained. The surface light source device thus obtained had a rectangular light-emitting surface capable of emitting white light from the first light diffusion layer of the optical sheet 1.

1-8. Evaluation

Regarding the surface light source device obtained in the aforementioned (1-7), color unevenness due to variation in viewing angle was measured as follows.

A spectral radiance meter (BM-5 manufactured by Topcon Corporation) was placed in the normal direction of the device light-emitting surface. A constant current of 100 mA/m² was applied to the surface light source device, and the light-emitting surface thereof was rotated so as to change the observation direction of the spectral radiance meter with respect to the light-emitting surface, and the chromaticity (x, y) was measured. The observation direction was varied in a direction parallel to the long side of the light-emitting surface in a range of −90 to 90° with the front (normal direction) being 0°, and amounts of change Δxy in chromaticity (x, y) within the observation angle range of ±60° were obtained. The results are shown in Table 1.

Comparative Example 1

The optical sheet and the surface light source device were obtained and evaluated in the same manner as that of Example 1 except that the particles were not added in the preparation of the coating liquid (2) in (1-2). The evaluation results are shown in Table 1.

Comparative Example 2

The resin composition (1) was obtained in the same manner as that of (1-1) in Example 1 except that the containing ratio of the particles was set to 15% by weight in the total amount of the resin composition (1). The viscosity of the resin composition (1) was 700 cP.

An optical sheet and a surface light source device were obtained and evaluated in the same manner as that of Example 1 except that this resin composition (1) was used and no particles were added in the preparation of the coating liquid (2) in (1-2). The evaluation results thereof are shown in Table 1.

Comparative Example 3

The organic EL element obtained in (1-6) of Example 1 as it is was used as a surface light source device, and amounts of change Δxy in chromaticity (x, y) were measured in the same manner as that of (1-8). The results are shown in Table 1.

TABLE 1

|  | Haze x1 (%) | Haze x2 (%) | Optical sheet Light transmittance unevenness (%) | Resin composition (1) viscosity (cP) | Color unevenness Δxy |
|---|---|---|---|---|---|
| Example 1 | 80 | 78 | 2.5 | 500 | 0.027 |
| Comp. Ex. 1 | 80 | Not more than 1 | 4.5 | 500 | 0.030 |
| Comp. Ex. 2 | 86 | Not more than 1 | 4.5 | 700 | 0.027 |
| Comp. Ex. 3 | — | — | — | — | 0.057 |

As is apparent from the results in Table 1, Example 1 in which the haze values x1 and x2 and the haze of the entire optical sheet fell within the predetermined range of the present invention resulted in a low degree of transmittance unevenness and a low degree of color unevenness in spite of the use of the resin composition (1) having a high viscosity (it is advantageous in increasing the hardness of the surface and enhancing the light extraction efficiency by the formation using a photopolymer method, but it is more likely to generate transmittance unevenness).

In contrast, Comparative Example 1 in which haze x2 was too low to satisfy the requirement of the present invention resulted in large degrees of transmittance unevenness and color unevenness.

In Comparative Example 2 in which the haze of the entire optical sheet was equivalent to that of Example 1 but the relationship between the haze values x1 and x2 failed to satisfy the requirement of the present invention, although the level of color unevenness was able to be reduced, a large degree of transmittance unevenness occurred since coating unevenness was likely to occur due to the high diffusing property of the resin composition (1) and the high viscosity thereof. The measured value of the transmittance unevenness in Comparative Example 2 was 4.5%, which was equivalent to that in Comparative Example 1. Based on the visual observation result of the light-emitting surface, however, a tendency that Comparative Example 2 had a larger degree of unevenness than Comparative Example 1 was observed.

Reference Example 1

Optical sheets and surface light source devices having various haze values of the first light diffusion layer and the second light diffusion layer were produced in the same manner as that of Example 1 except that the containing ratio of the particles added to the resin composition (1) and the coating liquid (2) were variously changed. The respective haze values x1 and x2 and entire haze values are as shown in Table 2.

These were visually evaluated as to whether coating unevenness was observed or not on the surface of the first light diffusion layer side in accordance with the following evaluation criteria.

Bad: coating unevenness was observed (approximately corresponding to light transmittance unevenness of 3% or more).

Good: no coating unevenness was observed (approximately corresponding to light transmittance unevenness of less than 3%).

Further, improvement in color unevenness was also visually observed, and evaluated in accordance with the following evaluation criteria.

Bad: color unevenness was observed.
Good: no color unevenness was observed.
These results are shown in Table 2.

TABLE 2

|  |  | f(x1) = 1.25 x1 = 50 | f(x1) = 6.10 x1 = 75 | f(x1) = 9.17 x1 = 80 | f(x1) = 15.87 x1 = 85 | f(x1) = 21.98 x1 = 87 | f(x1) = 27.50 x1 = 88 |
|---|---|---|---|---|---|---|---|
| f(x2) = 1.25 | x2 = 50 | 0.5 | 0.83 | 0.88 | 0.93 | 0.95 | 0.96 |
|  |  | 2.5 | 7.3 | 10.4 | 17.1 | 23.2 | 28.7 |
|  |  | Good | Bad | Bad | Bad | Bad | Bad |
|  |  | Bad | Bad | Bad | Good | Good | Good |
| f(x2) = 6.10 | x2 = 75 | 0.17 | 0.5 | 0.6 | 0.72 | 0.78 | 0.82 |
|  |  | 7.4 | 12.2 | 15.3 | 22 | 28.1 | 33.6 |
|  |  | Good | Good | Good | Bad | Bad | Bad |
|  |  | Bad | Good | Good | Good | Good | Good |
| f(x2) = 9.17 | x2 = 80 | 0.12 | 0.4 | 0.5 | 0.63 | 0.71 | 0.78 |
|  |  | 10.4 | 15.3 | 18.3 | 25 | 31.2 | 36.7 |
|  |  | Good | Good | Good | Good | Bad | Bad |
|  |  | Bad | Good | Good | Good | Good | Good |
| f(x2) = 15.87 | x2 = 85 | 0.07 | 0.28 | 0.37 | 0.5 | 0.58 | 0.71 |
|  |  | 17.1 | 22 | 25.0 | 31.7 | 37.9 | 43.4 |
|  |  | Good | Good | Good | Good | Good | Bad |
|  |  | Good | Good | Good | Good | Good | Good |
| f(x2) = 27.53 | x2 = 88 | 0.04 | 0.18 | 0.25 | 0.37 | 0.44 | 0.5 |
|  |  | 28.8 | 33.6 | 36.7 | 43.4 | 49.5 | 55 |
|  |  | Good | Good | Good | Good | Good | Good |
|  |  | Good | Good | Good | Good | Good | Good |

The numerical values and symbols in each item represent the followings.
Top row: value of $f(x1)/(f(x1)+f(x2))$
Second row from the top: $f(x1)+f(x2)$
Third row from the top: evaluation result regarding coating unevenness
Bottom row: evaluation result regarding color unevenness From the results of Table 2, it is apparent that an optical sheet capable of achieving both a low degree of coating unevenness and a low degree of color unevenness an be obtained especially in a case where the value of $f(x1)/(f(x1)+f(x2))$ and the value of $f(x1)+f(x2)$ fall within the predetermined range of the present invention.

Reference Signs List

10: surface light source device
10U: Sheet surface
11A-11D: Oblique faces
11E-11H: Bottom edges of concave portion
111: First light diffusion layer
112: Second light diffusion layer
113: Concave portion
114: Flat portion
121: Transparent substrate
131: Substrate
140: Organic EL element
141: First electrode layer
142: Light-emitting layer
143: Second electrode layer
151: Sealing substrate

What is claimed is:

1. An optical sheet comprising:
   a transparent substrate having a first surface S1 and a second surface S2;
   a first light diffusion layer provided on a first surface S1 side of the transparent substrate; and
   a second light diffusion layer provided on a second surface S2 side of the transparent substrate, wherein
   the first light diffusion layer has a first surface D1 and a second surface D2, and the first surface D1 is a surface being opposite to the transparent substrate and is a smooth surface, a haze x1 (%) of the first light diffusion layer and a haze x2 (%) of the second light diffusion layer satisfy the following expressions (1) and (2):

$$f(x1)/(f(x1)+f(x2)) \leq 2/3 \quad \text{expression (1)}$$

$$(f(x1)+f(x2)) \leq 12 \quad \text{expression (2)}$$

(where when x≤88, a function $f(x)=1.9\times(\ln(1-x/90))^2$, and when x>88, the function $f(x)=22.5x-1952.5$), and total light transmittance if the optical sheet is 50% or more.

2. An optical sheet comprising:
a transparent substrate having a first surface S1 and a second surface S2;
a first light diffusion layer provided on a first surface S1 side of the transparent substrate; and
a second light diffusion layer provided on a second surface S2 side of the transparent substrate, wherein
the first light diffusion layer has a first surface D1 and a second surface D2, and the first surface D1 is a surface being opposite to the transparent substrate and is a surface having a concavo-convex structure,
a haze x1 (%) of a light diffusion layer made of the same material and having the same thickness as the first light diffusion layer and having no concavo-convex structure of the first light diffusion layer and a haze x2 (%) of the second light diffusion layer satisfy the following expressions (1) and (2):

$$f(x1)/(f(x1)+f(x2)) \leq 2/3 \quad \text{expression (1)}$$

$$(f(x1)+f(x2)) \leq 12 \quad \text{expression (2)}$$

(where when x≤88, a function $f(x)=1.9\times(\ln(1-x/90))^2$, and when x>88, the function $f(x)=22.5x-1952.5$), and total light transmittance of the optical sheet is 50% or more.

3. The optical sheet according to claim 1, wherein the first light diffusion layer is formed from a composition including a resin and a diffusing element.

4. The optical sheet according to claim 1, wherein the second light diffusion layer is an adhesion layer.

5. A surface light source device comprising the optical sheet according to claim 1 and an organic electroluminescent element.

6. The optical sheet according to claim 2, wherein the first light diffusion layer is formed from a composition including a resin and a diffusing element.

7. The optical sheet according to claim 2, wherein the second light diffusion layer is an adhesion layer.

8. A surface light source device comprising the optical sheet according to claim 2 and an organic electroluminescent element.

* * * * *